US007391231B2

(12) United States Patent
Gomez et al.

(10) Patent No.: US 7,391,231 B2
(45) Date of Patent: Jun. 24, 2008

(54) SWITCH SELECTABLE TERMINATOR FOR DIFFERENTIAL AND PSEUDO-DIFFERENTIAL SIGNALING

(75) Inventors: Carlos I. Gomez, Austin, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/390,786

(22) Filed: Jun. 19, 2006

(65) Prior Publication Data

US 2007/0290712 A1 Dec. 20, 2007

(51) Int. Cl.
*H03K 17/16* (2006.01)
*H03K 19/003* (2006.01)

(52) U.S. Cl. .............................. 326/30; 326/82; 326/86

(58) Field of Classification Search ................... 326/26, 326/30, 31, 86, 82, 83; 327/108, 109, 63, 327/65, 99, 89

See application file for complete search history.

(56) References Cited

U.S. PATENT DOCUMENTS

| | | | |
|---|---|---|---|
| 4,935,951 A | 6/1990 | Robinson et al. |
| 4,993,058 A | 2/1991 | McMinn et al. |
| 5,012,507 A | 4/1991 | Leighton et al. |
| 5,161,180 A | 11/1992 | Chavous |
| RE34,677 E | 7/1994 | Wang et al. |
| 5,511,111 A | 4/1996 | Serbetcioglu et al. |
| 5,526,406 A | 6/1996 | Luneau |
| 5,621,379 A | 4/1997 | Collins |
| 5,673,304 A | 9/1997 | Connor et al. |
| 5,724,412 A | 3/1998 | Srinivasan |
| 5,796,806 A | 8/1998 | Birckbichler |
| 5,805,587 A | 9/1998 | Norris et al. |
| 5,883,942 A | 3/1999 | Lim et al. |
| 5,940,474 A | 8/1999 | Ruus |
| 5,940,475 A | 8/1999 | Hansen |
| 6,009,148 A | 12/1999 | Reeves |
| 6,011,473 A | 1/2000 | Klein |
| 6,104,800 A | 8/2000 | Benson |

(Continued)

OTHER PUBLICATIONS

U.S. Appl. No. 11/318,110, filed Dec. 2005.

(Continued)

*Primary Examiner*—Rexford Barnie
*Assistant Examiner*—Crystal L Hammond
(74) *Attorney, Agent, or Firm*—Casimer K. Salys; Winstead, P.C.

(57) ABSTRACT

An active terminator is configured with switches to select between terminating two lines for transmitting one differential signal pair or two single ended signals terminated in a pseudo-differential receiver. The receiver circuitry is configured with three differential comparators. One differential comparator receives both signal lines and other two differential comparators each receive one signal line and a reference voltage. The signal lines are terminated in a resistive voltage divider with electronic switches coupling the positive and ground voltages. The top and bottom nodes of the resistor divider in both terminators are cross-coupled with pass gates. In the pseudo-differential mode the pass gates are OFF and the electronic switches are ON with known resistances. In the differential mode, the electronic switches are OFF and the pass gates are ON with known resistances. The pass gate and switch resistances are sized with the resistors to insure a desired termination impedance.

20 Claims, 8 Drawing Sheets

U.S. PATENT DOCUMENTS

| | | | |
|---|---|---|---|
| 6,144,644 | A | 11/2000 | Bajzath et al. |
| 6,208,718 | B1 | 3/2001 | Rosenthal |
| 6,208,726 | B1 | 3/2001 | Bansal et al. |
| 6,219,413 | B1 | 4/2001 | Burg |
| 6,259,692 | B1 | 7/2001 | Shtivelman |
| 6,307,920 | B1 | 10/2001 | Thomson et al. |
| 6,310,946 | B1 | 10/2001 | Bauer et al. |
| 6,343,115 | B1 | 1/2002 | Foladare et al. |
| 6,347,136 | B1 | 2/2002 | Horan |
| 6,356,756 | B1 | 3/2002 | Koster |
| 6,434,126 | B1 | 8/2002 | Park |
| 6,476,763 | B2 | 11/2002 | Allen, Jr. |
| 6,492,846 | B1 * | 12/2002 | Taguchi et al. ............... 327/112 |
| 6,504,412 | B1 * | 1/2003 | Vangal et al. ............... 327/203 |
| 6,529,500 | B1 | 3/2003 | Pandharipande |
| 6,603,977 | B1 | 8/2003 | Walsh et al. |
| 6,605,958 | B2 * | 8/2003 | Bergman et al. ............... 326/30 |
| 6,608,886 | B1 | 8/2003 | Contractor |
| 6,622,016 | B1 | 9/2003 | Sladek et al. |
| 6,624,754 | B1 | 9/2003 | Hoffman et al. |
| 6,661,785 | B1 | 12/2003 | Shang et al. |
| 6,665,388 | B2 | 12/2003 | Bedingfield |
| 6,665,611 | B1 | 12/2003 | Oran et al. |
| 6,674,745 | B1 | 1/2004 | Schuster et al. |
| 6,678,357 | B2 | 1/2004 | Stumer et al. |
| 6,680,998 | B1 | 1/2004 | Bell et al. |
| 6,683,472 | B2 * | 1/2004 | Best et al. ............... 326/30 |
| 6,703,930 | B2 | 3/2004 | Skinner |
| 6,718,021 | B2 | 4/2004 | Crockett et al. |
| 6,771,742 | B2 | 8/2004 | McCalmont et al. |
| 6,792,081 | B1 | 9/2004 | Contractor |
| 6,804,338 | B1 | 10/2004 | Chen |
| 6,842,448 | B1 | 1/2005 | Norris et al. |
| 6,868,074 | B1 | 3/2005 | Hanson |
| 6,912,399 | B2 | 6/2005 | Zirul et al. |
| 6,924,659 | B1 * | 8/2005 | Andrews et al. ............... 326/30 |
| 6,940,950 | B2 | 9/2005 | Dickinson et al. |
| 7,208,972 | B2 * | 4/2007 | Dreps et al. ............... 326/26 |
| 2002/0072348 | A1 | 6/2002 | Wheeler et al. |
| 2002/0160745 | A1 | 10/2002 | Wang |
| 2003/0211839 | A1 | 11/2003 | Baum et al. |
| 2003/0216148 | A1 | 11/2003 | Henderson |
| 2004/0037403 | A1 | 2/2004 | Koch |
| 2004/0057425 | A1 | 3/2004 | Brouwer et al. |
| 2004/0101123 | A1 | 5/2004 | Garcia |
| 2004/0140928 | A1 | 7/2004 | Cleghorn |
| 2005/0047574 | A1 | 3/2005 | Reid |
| 2005/0063519 | A1 | 3/2005 | James |
| 2005/0151642 | A1 | 7/2005 | Tupler et al. |
| 2005/0175166 | A1 | 8/2005 | Welenson et al. |
| 2005/0190750 | A1 | 9/2005 | Kafka et al. |
| 2005/0190892 | A1 | 9/2005 | Dawson et al. |
| 2005/0232243 | A1 | 10/2005 | Adamczyk et al. |
| 2005/0250468 | A1 | 11/2005 | Lu |

OTHER PUBLICATIONS

US 5,905,788, 05/1999, Bauer et al. (withdrawn)

\* cited by examiner

SWITCH SELECTABLE TERMINATOR FOR DIFFERENTIAL AND PSEUDO-DIFFERENTIAL SIGNALING

TECHNICAL FIELD

The present invention relates in general to board level transmission line drivers and receivers, and in particular, to references for differential and pseudo-differential drivers and receivers.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (cross talk) affects signal quality. One way to alleviate the detrimental effects of noise and coupling is through the use of differential signaling. Differential signaling comprises sending a signal and its compliment to a differential receiver. In this manner, noise and coupling affect both the signal and the compliment equally. The differential receiver only senses the difference between the signal and its compliment as the noise and coupling represent common mode signals. Therefore, differential signaling is resistant to the effects that noise and cross talk have on signal quality. On the negative side, differential signaling increases pin count by a factor of two for each data line. The next best thing to differential signaling is pseudo-differential signaling. Pseudo-differential signaling comprises comparing a data signal to a reference voltage using a differential receiver or comparator.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. Typically, a Thevenin's resistance (equivalent resistance of the Thevenin's network equals characteristic impedance of transmission line) is used to terminate data lines allowing the use of higher valued resistors. Additionally, the Thevenin's network is used to establish a bias voltage between the power supply rails. In this configuration, the data signals will then swing around this Thevenin's equivalent bias voltage. When this method is used to terminate data signal lines, a reference voltage is necessary to bias a differential receiver that operates as a pseudo-differential receiver to detect data signals in the presence of noise and cross talk.

Sometimes pseudo-differential signaling is not adequate for a desired signal quality and true differential signaling is needed at the expense of reduced bandwidth. The signal lines for pseudo-differential signaling are individually terminated to eliminate reflections. Typically a voltage divider provides a bias voltage as well as generating the proper impedance level by the parallel combination of the resistors in the voltage divider. In a true differential receiver, the termination resistance is usually placed across the two signal lines. Configuring a communication network so that either differential or pseudo-differential signaling could be used with a termination network that was switchable would lead to excessive capacitive loading unless a novel approach was used. Therefore, there is a need for a switch selectable termination system that enables both true differential and pseudo-differential signaling while minimizing capacitive loading.

SUMMARY OF THE INVENTION

A communication network is configured as signal pairs with the two signal lines terminated in a switch selectable termination network. The individual signal lines are each coupled to the positive input of a pseudo-differential comparator which has the negative input coupled to a reference voltage. Each of the signal lines are terminated in the common node of a resistor voltage divider that has its positive and negative nodes coupled to the positive and negative power supply voltages, respectively, with electronic switches. The positive nodes of the voltage divider terminators are cross-coupled with pass gates to the corresponding negative nodes. In this manner, two data signals may be transmitted and received using pseudo differential signaling. If true differential signaling is required, then the electronic switches are turned OFF and the pass gates are gated ON with a known resistance. This results in the voltage divider resistors being coupled in series with a pass gate and in parallel across the two signal lines. The parallel combination of the resistances is sized to correctly terminate the differential lines. The electronic switches are sized with the voltage divider resistors to provide the required pseudo terminating resistance and the pass gates are sized so that the series/parallel combination of the pass gates and the voltage divider resistors provides the required differential terminating resistance.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
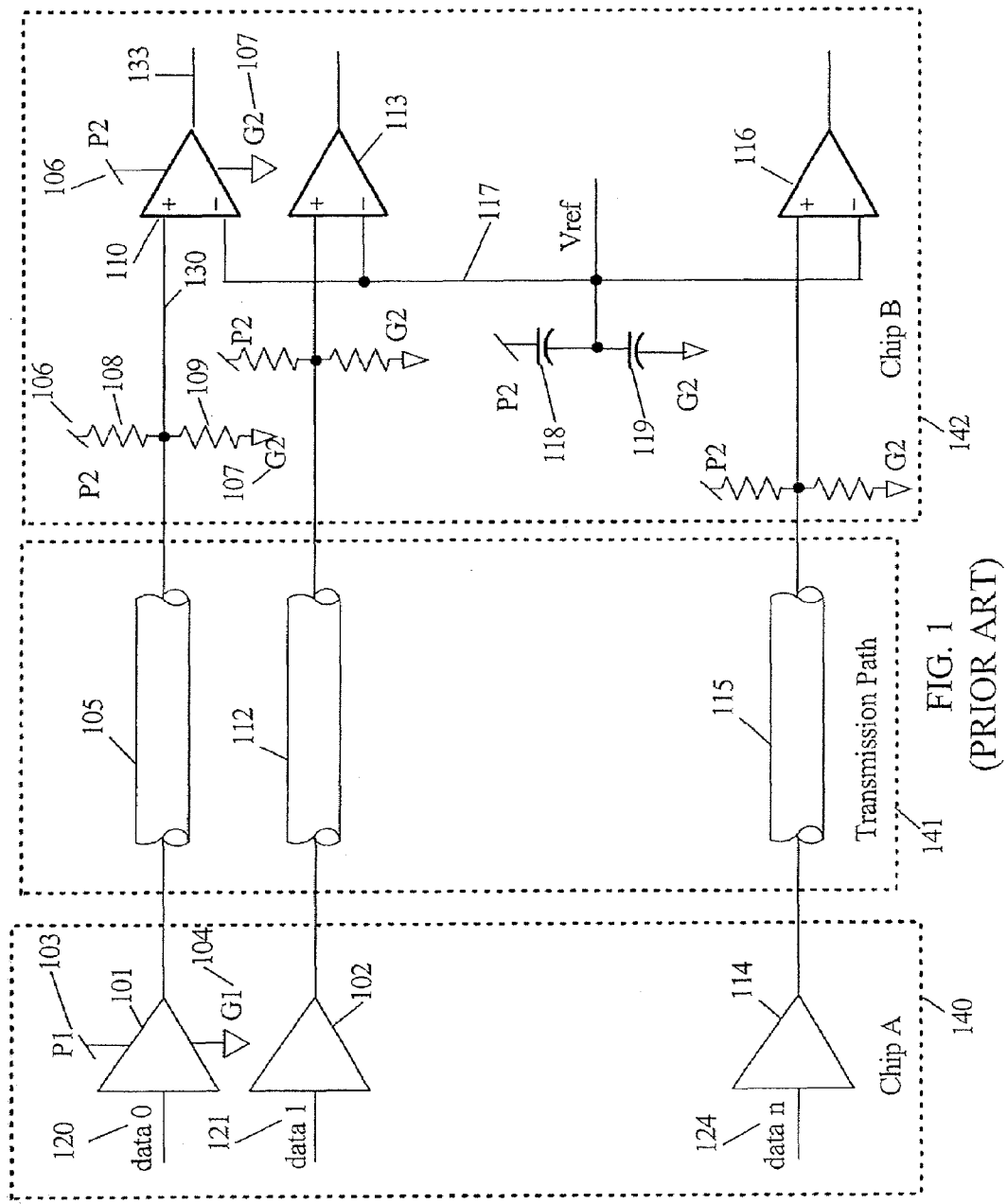
FIG. 1 is a circuit diagram of prior art pseudo-differential signaling.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a circuit diagram of typical pseudo-differential signaling for transmitting data from drivers in a Chip A 140 to receivers in a Chip B 142 via a transmission path 141. Drivers 101, 102 and 114 represent three of a number of n drivers sending data to receivers 110, 113 and 116, respectively. Exemplary driver 101 receives data 0 120 and generates an output that swings between power supply rail voltages P1 103 (logic one) and G1 104 (logic zero). When the output of driver 101 is at P1 103, any noise on the power bus is coupled to transmission line 105 along with the logic state of the data signal. Exemplary transmission line 105 is terminated with a voltage divider comprising resistors 108 and 109. Receiver input 130 has a DC bias value determined by the voltage division ratio of resistors 108 and 109 and the voltage between P2 106 and G2 107. Receiver 110 is powered by voltages P2 106 and G2 107 which may have different values from P1 103 and G1 104 due to distribution losses, noise coupling, and dynamic impedance of the distribution network. Exemplary receiver 110 is typically a voltage comparator or high gain amplifier that amplifies the difference between a signal at input 130 and a reference voltage Vref 117. Voltage reference Vref 117 may be programmable and generated by a variety of techniques.

Figure 2:
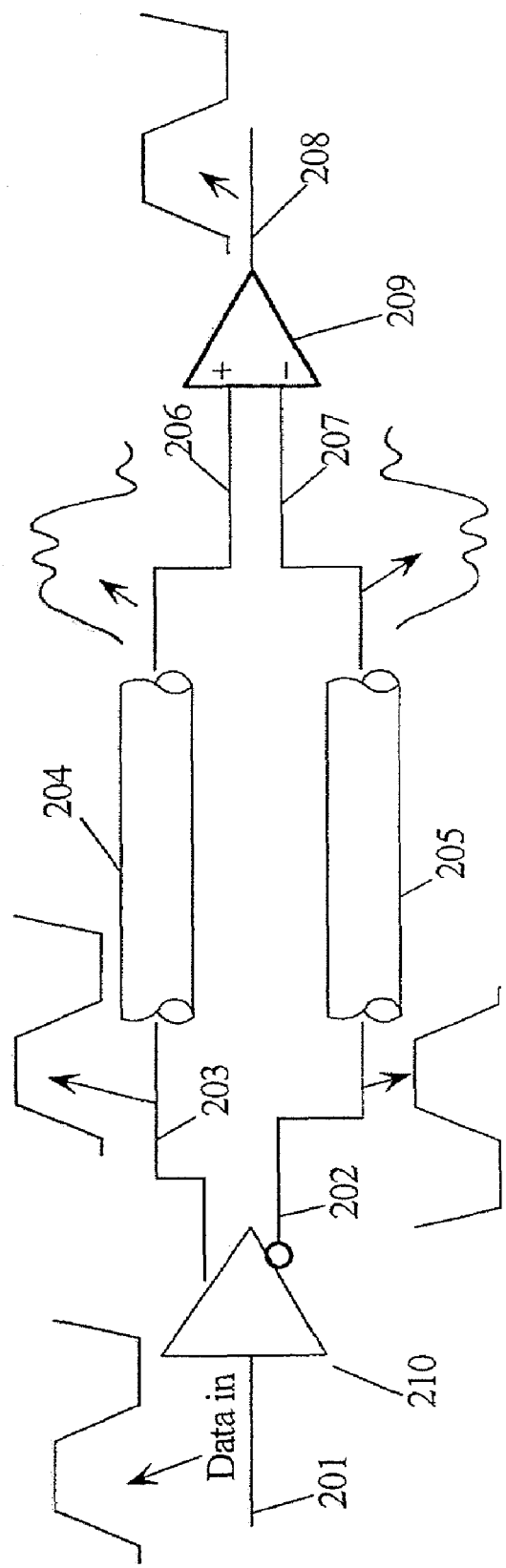
FIG. 2 is a circuit diagram of differential signaling.

FIG. 2 is a circuit diagram of true differential signaling. Data in 201 is coupled to a differential driver 210 that generates a digital signal 203 and the complement of the digital signal 202. These two signals are transmitted over transmission lines 204 and 205. A differential receiver 209 has a positive input receiving signal 206 and a negative input receiving complementary signal 207. Signals 206 and 207 are shown with analog features of overshoot, undershoot, and ringing consistent with effects seen when transmission paths are not ideal. Receiver 209 converts the differential signals back to a digital signal 208 whose signal quality and characteristics are dependent on the amount of distortion experienced by signals 206 and 207 and the ability of differential receiver 209 to reject common mode variations.

Figure 3A:
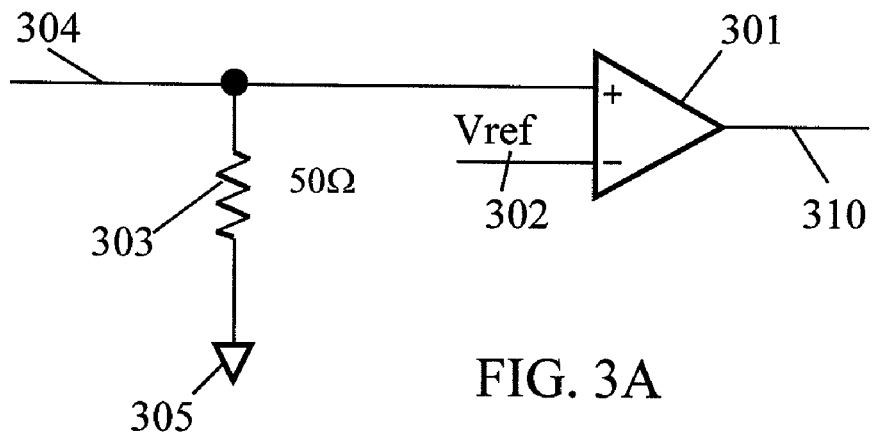
FIG. 3A is a circuit diagram illustrating the termination of a pseudo differential signal line to ground.

FIG. 3A is a circuit diagram of a pseudo-differential receiver 301 where signal node 304 is terminated to ground potential 305 with resistor 303. A signal on node 304 is compared to Vref 302 and pseudo-differential receiver 301 generates a detected output at node 310.

Figure 3B:
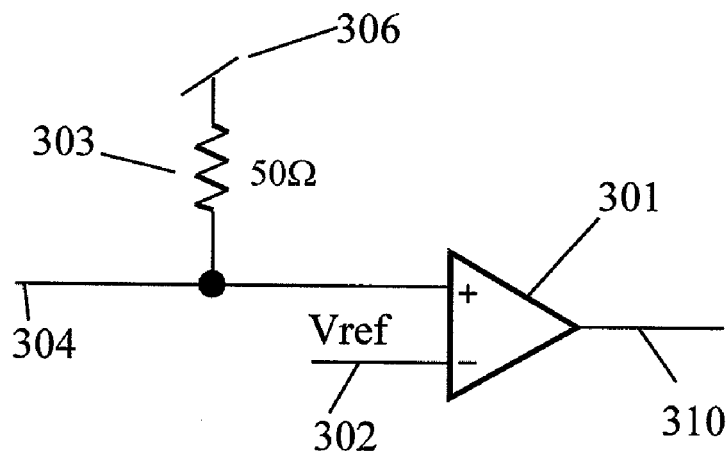
FIG. 3B is a circuit diagram illustrating the termination of a pseudo differential signal line to the positive supply voltage.

FIG. 3B is a circuit diagram of a pseudo-differential receiver 301 where signal node 304 is terminated to positive voltage potential 306 with resistor 303. A signal on node 304 is compared to Vref 302 and pseudo-differential receiver 301 generates a detected output at node 310. The high frequency impedance between positive voltage potential 306 and ground potential 305 is considered low enough that the circuit configurations FIG. 3A and FIG. 3B are considered to have equivalent termination impedances.

Figure 3C:
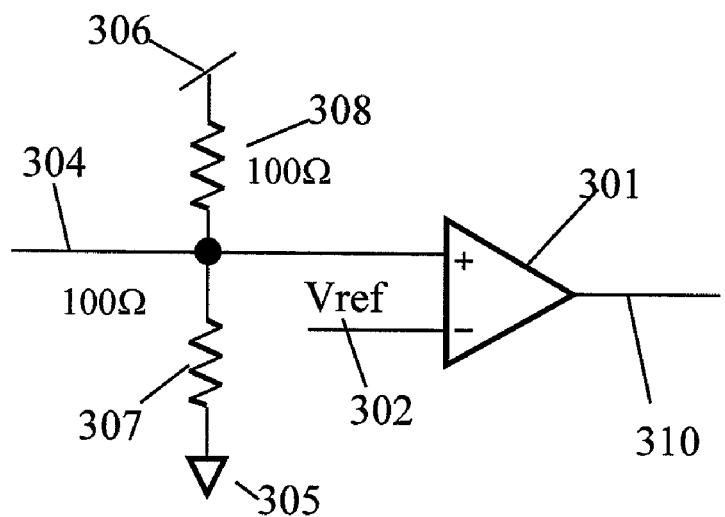
FIG. 3C is a circuit diagram illustrating voltage divider termination of a pseudo differential signal line.

FIG. 3C is a circuit diagram of a pseudo-differential receiver 301 where signal node 304 is terminated in a voltage divider comprising resistors 307 and 308 between positive voltage potential 306 and ground potential 305. A signal on node 304 is compared to Vref 302 and pseudo-differential receiver 301 generates a detected output at node 310. Resistors 307 and 308 are sized so their parallel combination is equivalent to resistor 303. Resistors 307 and 308 set a bias potential (e.g., one half of positive voltage potential 306) at node 304. Again, the high frequency impedance between positive voltage potential 306 and ground potential 305 is considered low enough that the circuit configurations FIG. 3A, 3B and FIG. 3C may have the equivalent termination impedances.

Figure 4:
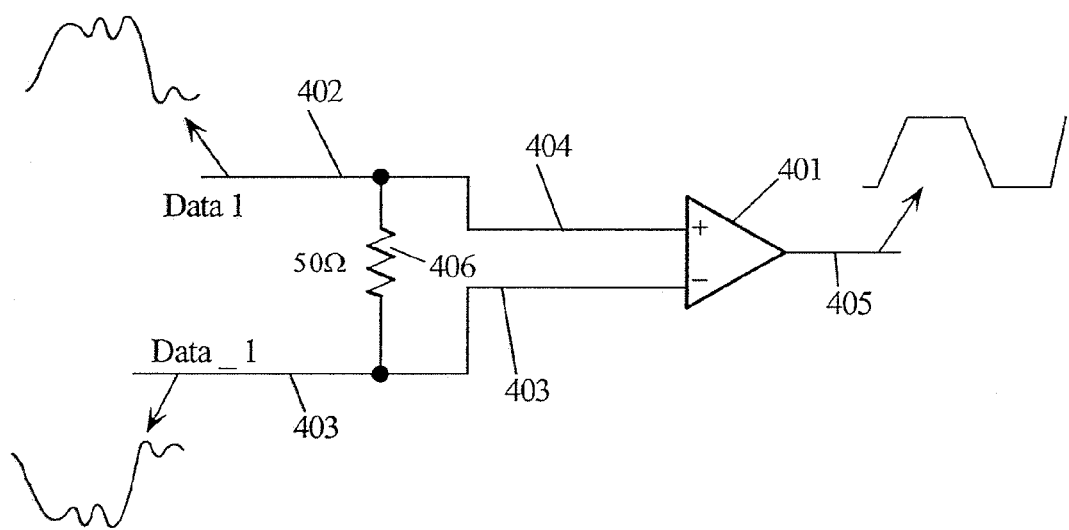
FIG. 4 is a circuit diagram of across line termination of differential signal lines.

FIG. 4 is a circuit diagram of a differential receiver 401 having a positive input 404 coupled to signal Data 1 402 and a negative input 403 coupled to complementary signal Data_1 403. Resistor 406 is coupled between inputs 403 and 404 to set the differential termination impedance (shown as 50 ohms).

Figure 5:
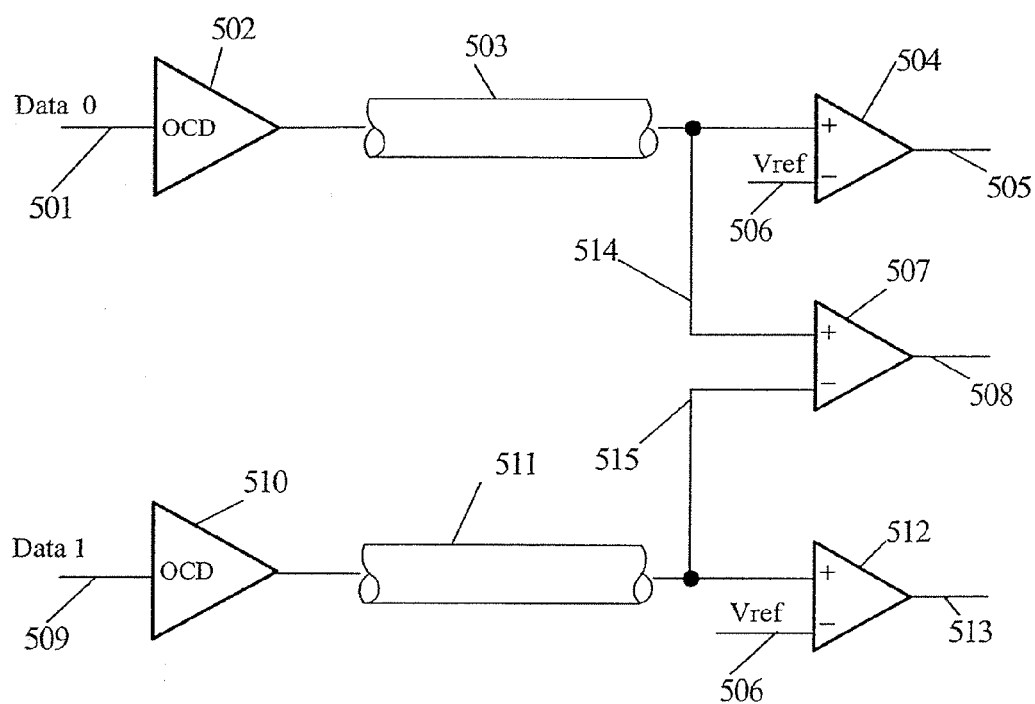
FIG. 5 is a circuit diagram of two signal lines simultaneously coupled to a pseudo-differential comparator circuit and to a differential comparator.

FIG. 5. is a circuit diagram illustrating two data channels or paths that may be used to transmit one differential signal or two single ended signals. If Data 0 501 and Data 1 509 are independent data signals, then the outputs 505 and 513, respectively, of pseudo-differential receivers 504 and 512 may be enabled to generate corresponding detected data signals. If Data 0 501 and Data 1 509 are complementary data signals, then the output 508 of differential receiver 507 may be enabled to generate a corresponding detected data signal. Thus, transmission lines 503 and 511 either transmit a single differential data signal or two independent data signals. Output nodes 514 and 515 are coupled to all three receivers and gating (not shown) would be used to steer the desired detected signal to down-stream logic.

Figure 6:
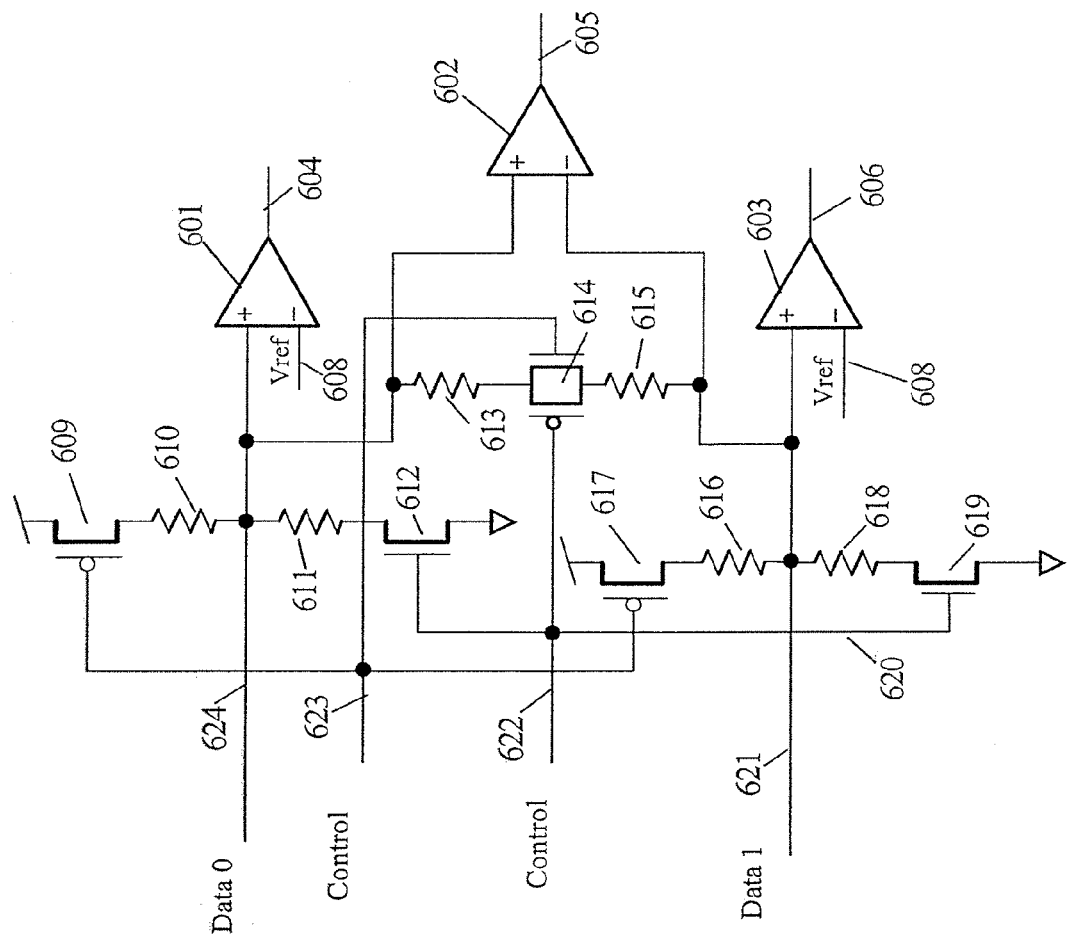
FIG. 6 is a circuit diagram illustrating a termination network suitable to switch between differential and pseudo-differential signaling.

FIG. 6. is a circuit diagram of two data channels that are switch selectable for use as true differential or pseudo-differential signaling according to embodiments of the present invention. For true differential signaling, differential receiver 602 with output 605 is used and for two channel pseudo-differential signaling, receivers 601 and 603 coupled to Vref 608 generate detected signals at outputs 604 and 606. Data 0 624 and Data 1 621 may correspond to a single differential signal or may correspond to two independent data signals. Depending on which mode is desired, the termination network may be altered using control signals 622 and 623 to provide the best signal quality. Data 0 624 is terminated in a voltage divider network comprising resistors 610 and 611 and transistors 609 and 612. Likewise, Data 1 621 is terminated in a voltage divider network comprising resistors 616 and 618 and transistors 617 and 619. When pseudo-differential signals is desired, control signal 623 is set to a logic zero and control signal 622 is set to a logic one turning ON transistors 609, 612, 617, and 619 while turning OFF pass gate 614. This action couples resistors 610, 611, 616, and 618 to the signal lines and opens the connection between resistors 613 and 615 removing them from the data signal lines. In the differential mode, control signal 623 is a logic one and control signal 622 is a logic zero which turns OFF transistors 609, 612, 617, and 619 and turns ON pass gate 614. Even though the gating the transistors alters the resistive portion of the terminating impedance for signals Data 0 624 and Data 1 621, it does nothing to alter the capacitive loading resulting from the physical structure of resistors 610-611, 613, 615-616 and 618. The circuitry of FIG. 6 does provide a termination network that is switchable between true differential and pseudo-differential, however, its performance would suffer and may be inadequate for some high frequency signaling applications.

Figure 7:
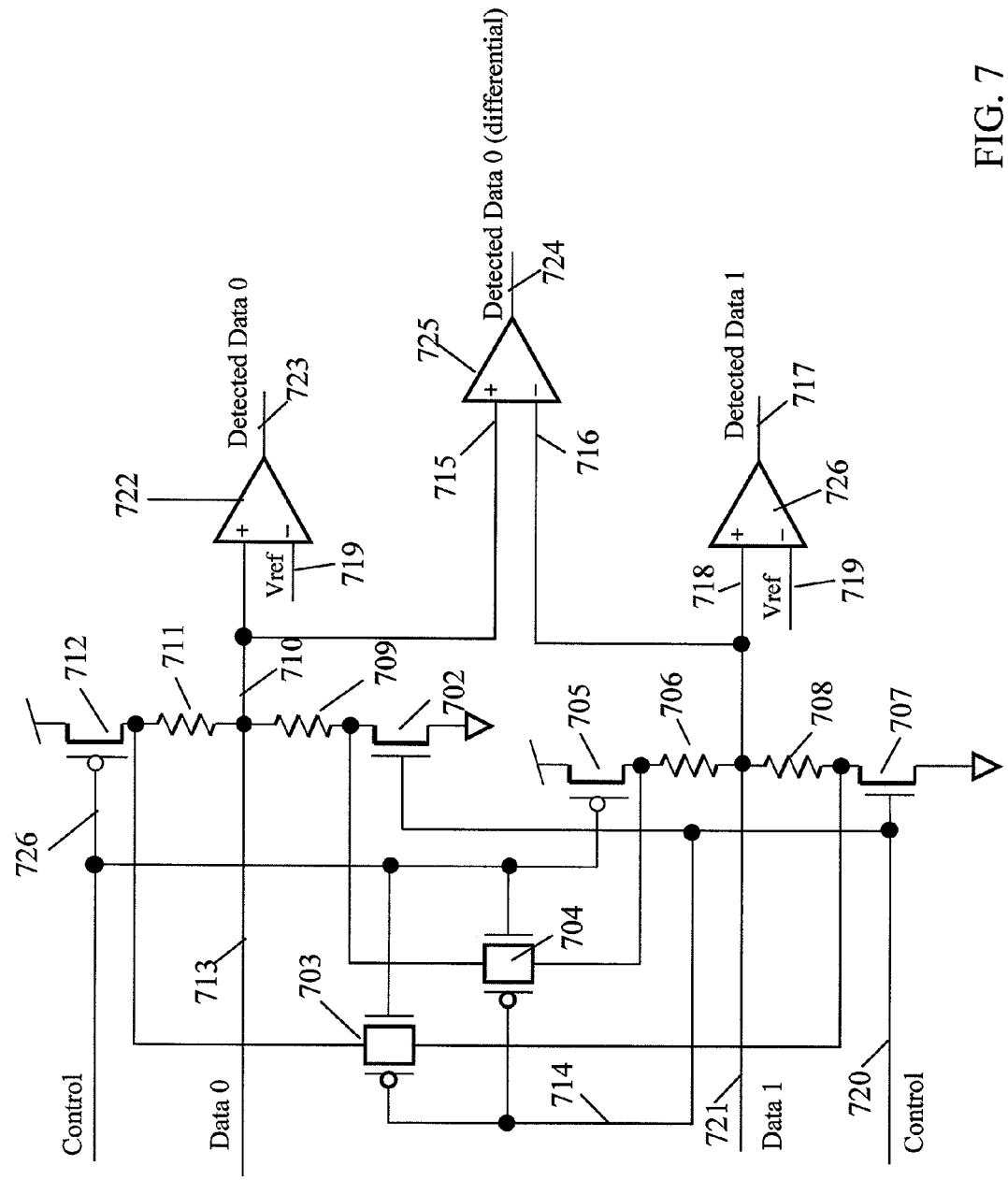
FIG. 7 is a circuit diagram illustrating a termination network suitable to switch between differential and pseudo-differential signaling according to embodiments of the presenting invention.

FIG. 7 is a circuit diagram of two data channels that are switch selectable for use as true differential or pseudo-differential signaling according to another embodiment of the present invention. As explained relative to FIG. 6, Data 0 713 and Data 1 721 may correspond to a single differential signal or may correspond to two independent data signals. Pseudo differential receivers 722 and 727 compare independent data signals at inputs 710 and 718, respectively, to Vref 719 and generate independent detected data signals at outputs 723 and 717. Likewise, differential receiver 725 amplifies the difference between a differential signal between inputs 715 and 716 to generate a detected data signal at output 724. Depending on which mode (pseudo-differential or true differential) was desired, the outputs 723 and 717 or 724 may be enabled for use by down-stream logic (not shown).

Inputs 710 and 715 are coupled to signal Data 0 713 and inputs 718 and 716 are coupled to signal Data 1 721. Only resistors 709, 711, 706 and 708 are directly coupled to these inputs and thus their parasitic capacitance is lower than the termination network in FIG. 6. Transistors 702, 712, 705 and 707 along with pass gates 703 and 704 are then used to determine the circuit configuration of resistors 709, 711, 706 and 708. In the pseudo-differential mode, resistors 709, 711, 706 and 708 are configured as voltage dividers between the positive and ground voltage potentials and in the differential mode they are configured to appear as a resistive load across inputs 715 and 716.

In the pseudo-differential mode, control signal 720 is set to a logic one and control signal 726 is set to a logic zero. Control signal 726 turns ON the P channel field effect transistors (PFET) 712 and 705 coupling the positive supply voltage to resistors 706 and 711. Likewise control signal 720 turns ON NFETs 707 and 702 coupling the ground potential to resistors 708 and 709. Since control signal 726 is coupled to the NFETs in pass gates 703 and 704 and control signal 720 is coupled to the corresponding PFETs, pass gates 703 and 704 are gated OFF. The pseudo-differential mode insures that one voltage divider (resistors 711 and 709) configuration appears at inputs 710 and 715 and the other voltage divider (resistors 706 and 708) appears at inputs 716 and 718. Gating circuitry (not shown) is used to direct outputs 717 and 723 to down-stream logic.

Since the PFETs 712 and 705 appear in series with resistors 711 and 706 and the NFETs 702 and 707 appear in series with resistors 708 and 709, their resistance may be sized to ensure a desired value when gated ON by control signals 720 and 726 in the pseudo-differential mode. Likewise, pass gates 703 and 704 have devices sized to ensure a desired termination resistance value for the series/parallel combination of resistors 709, 711, 706, and 708 in the true differential mode. For an exemplary network providing a 50 ohm single ended termination and a 100 ohm differential termination, resistors 709, 711, 706, and 708 are set to 75 ohms, PFETs 712 and 705 and NFETs 702 and 707 are configured to have an ON resistance of 25 ohms, and pass gates 703 and 704 are configured to have an ON resistance of 50 ohms.

In the true differential mode, control signal 720 is set to a logic zero and control signal 726 is set to a logic one. Control signal 726 turns OFF PFETs 712 and 705 decoupling the positive supply voltage from resistors 706 and 711. Likewise control signal 720 turns OFF NFETs 707 and 702 decoupling the ground potential from resistors 708 and 709. Since control signal 726 is coupled to the NFETs in pass gates 703 and 704 and control signal 720 is coupled to the corresponding PFETs, pass gates 703 and 704 are gated ON. The pseudo-differential mode ensures that resistors 711 and 708 are coupled in series and in parallel with the series connection of resistors 706 and 709. The series/parallel resistor combination now appears across inputs 710 and 718 and 715 and 716. Since the power supply voltages are decoupled from the resistors, the true differential termination is purely passive. Gating circuitry (not shown) is used to direct which output 724 to down-stream logic. The circuit configuration of FIG. 7 provides switch selectable termination for pseudo-differential and true differential signaling while minimizing capacitive loading thus improving high frequency performance.

Figure 8:
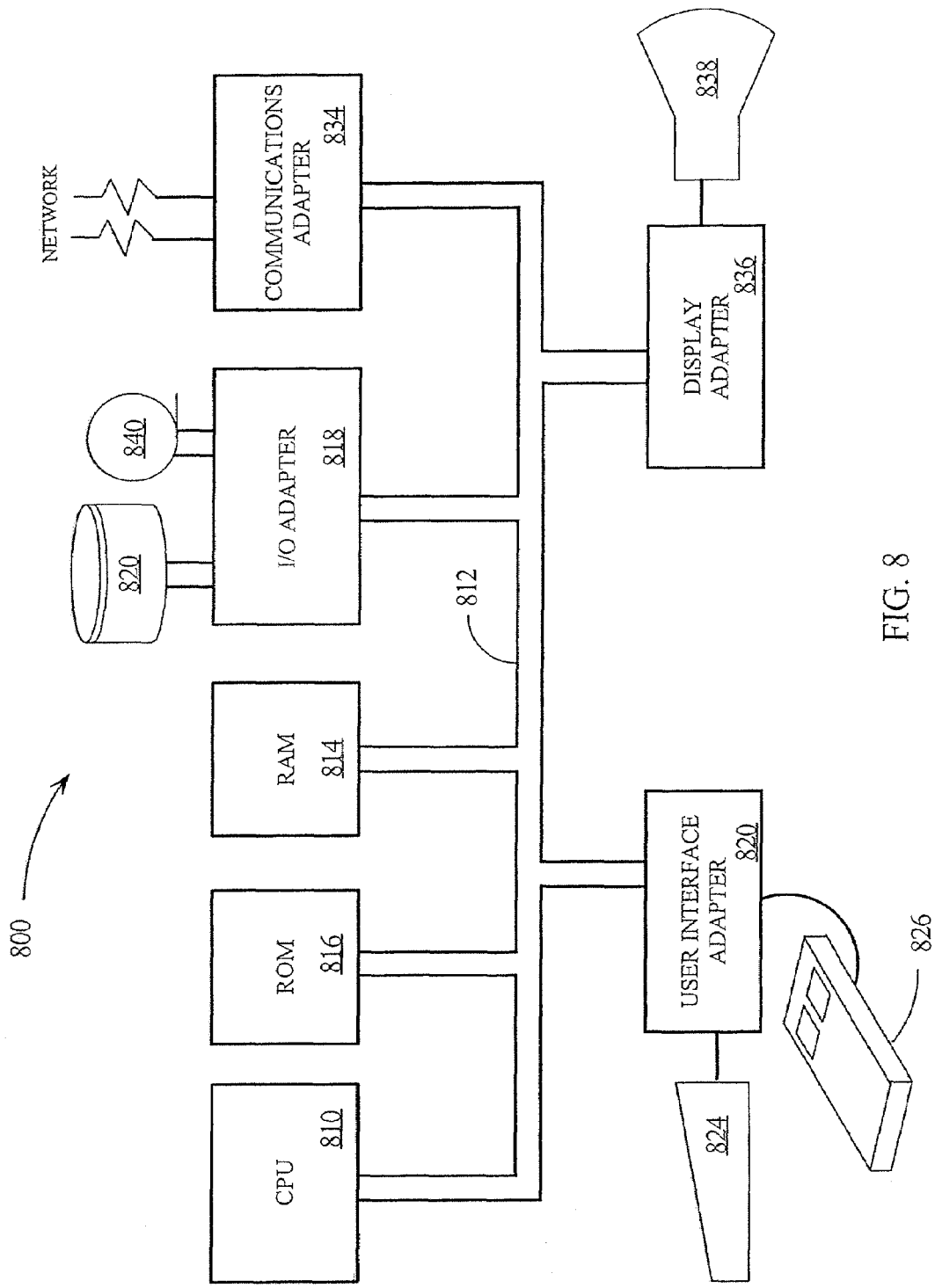
FIG. 8 is a block diagram of a data processing system suitable for using embodiments of the present invention.

FIG. 8 is a high level functional block diagram of a representative data processing system 800 suitable for practicing the principles of the present invention. Data processing system 800 includes a central processing system (CPU) 810 operating in conjunction with a system bus 812. System bus 812 operates in accordance with a standard bus protocol, such as the ISA protocol, compatible with CPU 810. CPU 810 operates in conjunction with electronically erasable programmable read-only memory (EEPROM) 816 and random access memory (RAM) 814. Among other things, EEPROM 816 supports storage of the Basic Input Output System (BIOS) data and recovery code. RAM 814 includes, DRAM (Dynamic Random Access Memory) system memory and SRAM (Static Random Access Memory) external cache. I/O Adapter 818 allows for an interconnection between the devices on system bus 812 and external peripherals, such as mass storage devices (e.g., a hard drive, floppy drive or CD/ROM drive), or a printer 840. A peripheral device 820 is, for example, coupled to a peripheral control interface (PCI) bus, and I/O adapter 818 therefore may be a PCI bus bridge. User interface adapter 822 couples various user input devices, such as a keyboard 824 or mouse 826 to the processing devices on bus 812. Exemplary display 838 may be a cathode ray tube (CRT), liquid crystal display (LCD) or similar conventional display units. Display adapter 836 may include, among other things, a conventional display controller and frame buffer memory. Data processing system 800 may be selectively coupled to a computer or telecommunications network 841 through communications adapter 834. Communications adapter 834 may include, for example, a modem for connection to a telecom network and/or hardware and software for connecting to a computer network such as a local area network (LAN) or a wide area network (WAN). CPU 810 and other components of data processing system 800 may contain logic circuitry in two or more integrated circuit chips that are separated by a significant distance relative to their communication frequency so that terminated transmission lines are needed to insure performance. Some of these lines may need to be switch selectable between true differential and pseudo-differential signaling improve reliability and thus need to have a corresponding termination network that is likewise switch selectable according to embodiments of the present invention to minimize performance degradation due to capacitive loading.

Although the present invention and its advantages have been described in detail, it should be understood that various changes, substitutions and alterations can be made herein without departing from the spirit and scope of the invention as defined by the appended claims.

What is claimed is:

1. A termination network for configuring the termination of first and second adjacent transmission lines for either two data line pseudo-differential signaling or single data line true differential signaling comprising:

first circuitry coupled to the first transmission line and configured in response to a first logic state of a first control signal to terminate the first transmission line in a first impedance referenced to a first bias voltage for pseudo-differential signaling, the first circuitry comprising a first differential receiving device;

second circuitry coupled to the second transmission line and configured in response to the first logic state of the first control signal to terminate the second transmission line in a second impedance referenced to a second bias voltage for pseudo-differential signaling, the second circuitry comprising a second differential receiving device; and third circuitry for coupling the first circuitry to the second circuitry thus configuring the first and second circuitry as a third impedance termination between the first and second transmission lines in response to a second logic state of the first control signal for true differential signaling.

2. The termination network of claim 1, wherein the first circuitry comprises:

a first resistor network having a first node, a second node and a common node coupled to the first transmission line;

a first electronic switch having a positive node coupled to a first voltage potential, a power node coupled to the first node of the first resistor network, and a control node coupled to turn ON the first electronic switch in response to the first logic state of the first control signal thereby coupling the power node of the first electronic switch to the positive node; and a second electronic switch having a negative node coupled to a second voltage potential, a power node coupled to the second node of the first resistor network, and a control node coupled to turn ON the second electronic switch in response to the first logic state of the first control signal thereby coupling the power node of the second electronic switch to the negative node.

3. The termination network of claim 2, wherein the second circuitry comprises:

a second resistor network having a first node, a second node and a common node coupled to the second transmission line;

a third electronic switch having a positive node coupled to the first voltage potential, a power node coupled to the first node of the second resistor network, and a control node coupled to turn ON the third electronic switch in response to the first logic state of the first control signal thereby coupling the power node of the third electronic switch to the positive node; and a fourth electronic switch having a negative node coupled to a second voltage potential, a power node coupled to the second node of the second resistor network, and a control node coupled to turn ON the fourth electronic switch in response to the first logic state of the first control signal thereby coupling the power node of the fourth electronic switch to the negative node.

4. The termination network of claim 3, wherein the third circuitry comprises:

a double pole single throw electronic switch having first and second inputs coupled to the first and second nodes, respectively, of the first resistor network and first and second outputs coupled to the first and second nodes, respectively, of the second resistor network, wherein the first and second inputs are coupled to the first and second outputs, respectively, in response to the second logic state of the first control signals.

5. The termination network of claim 4, wherein the double pole single throw electronic switch comprises:

a first pass gate having source node as the first input, a drain node as the first output, and a first gate node coupled to the first control signal and a second gate node coupled to a complement of the first control signal; and a second pass gate having source node as the second input, a drain node as the second output, and a first gate node coupled to the first control signal and a second gate node coupled to a complement of the first control signal.

6. The termination network of claim 5, wherein the first and second pass gates each comprise:

a P channel field effect transistor (PFET) having a source terminal coupled to the source node, a drain terminal coupled as the drain node and a gate terminal coupled to the first gate node; and an N channel field effect transistor (NFET) having a drain terminal coupled to the source node, a source terminal coupled as the drain node and a gate terminal coupled to the second gate node.

7. The termination network of claim 3, wherein the first and third electronic switches have pre-determined ON state resistances between their power nodes and their positive nodes.

8. The termination network of claim 7, wherein the second and fourth electronic switches have pre-determined ON state resistances between their power nodes and their negative nodes.

9. The termination network of claim 1 wherein:

the first differential receiving device comprises a first differential comparator having a positive input coupled to the first transmission line, a negative input coupled to a reference voltage and an output generating a first detected data signal in response to an amplified difference between a signal received on the first transmission line and the reference voltage when the first control signal has the first logic state; and the second differential receiving device comprises a second differential comparator having a positive input coupled to the second transmission line, a negative input coupled to the reference voltage and an output generating a second detected data signal in response to an amplified difference between a signal received on the second transmission line and the reference voltage when the first control signal has the first logic state.

10. The termination network of claim 1 further comprising a third differential comparator having a positive input coupled to the first transmission line, a negative input coupled to the second transmission line, and an output generating a detected differential data signal in response to an amplified difference between a signal level received on the first transmission line and a signal level received on the second transmission line when the first control signal has the second logic state.

11. The termination network of claim 8, wherein the first resistor network comprises:

a first resistor having a first terminal coupled as the first node and a second node coupled to the common node; and a second resistor having a first terminal coupled as the second node and a second node coupled to the common node.

12. The termination network of claim 11, wherein the second resistor network comprises:
a first resistor having a first terminal coupled as the first node and a second node coupled to the common node; and
a second resistor having a first terminal coupled as the second node and a second node coupled to the common node.

13. The termination network of claim 12, wherein the first impedance terminating the first transmission line when the first control signal has the first logic state comprises the combination of; the first resistor of the first resistor network in series with the ON resistance of the first electronic switch, in parallel with, the second resistor of the first resistor network in series with the ON resistance of the second electronic switch.

14. The termination network of claim 13, wherein the second impedance terminating the second transmission line when the first control signal has the first logic state comprises the combination of; the first resistor of the second resistor network in series with the ON resistance of the third electronic switch, in parallel with, the second resistor of the second resistor network in series with the ON resistance of the fourth electronic switch.

15. The termination network of claim 14, wherein the third impedance termination between the first and second transmission lines when the first control signal has the second logic state comprises the series combination of the resistance of a first pass gate, the first resistor of the first resistor network, and the second resistor of the second resistor network, in parallel with, the series combination of the resistance of a second pass gate, the first resistor of the second resistor network, and the second resistor of the first resistor network.

16. A data processing system comprising:
a central processing unit (CPU);
a random access memory (RAM);
an input output (110) interface unit; and
a bus for coupling the CPU, RAM and I/O interface unit, the data processing system having a termination network for configuring the termination of first and second adjacent transmission lines for either two data line pseudo-differential signaling or single data line true differential signaling having first circuitry coupled to the first transmission line and configured in response to a first logic state of a first control signal to terminate the first transmission line in a first impedance referenced to a first bias voltage for pseudo-differential signaling, the first circuitry comprising a first differential receiving device, second circuitry coupled to the second transmission line and configured in response to the first logic state of the first control signal to terminate the second transmission line in a second impedance referenced to a second bias voltage for pseudo-differential signaling, the second circuitry comprising a second differential receiving device, and third circuitry for coupling the first circuitry to the second circuitry thus configuring the first and second circuitry as a third impedance termination between the first and second transmission lines in response to a second logic state of the first control signal for true differential signaling.

17. The data processing system of claim 16, wherein the first circuitry comprises:
a first resistor network having a first node, a second node and a common node coupled to the first transmission line;
a first electronic switch having a positive node coupled to a first voltage potential, a power node coupled to the first node of the first resistor network, and a control node coupled to turn ON the first electronic switch in response to the first logic state of the first control signal thereby coupling the power node of the first electronic switch to the positive node; and
a second electronic switch having a negative node coupled to a second voltage potential, a power node coupled to the second node of the first resistor network, and a control node coupled to turn ON the second electronic switch in response to the first logic state of the first control signal thereby coupling the power node of the second electronic switch to the negative node.

18. The data processing system of claim 17, wherein the second circuitry comprises:
a second resistor network having a first node, a second node and a common node coupled to the second transmission line;
a third electronic switch having a positive node coupled to the first voltage potential, a power node coupled to the first node of the second resistor network, and a control node coupled to turn ON the third electronic switch in response to the first logic state of the first control signal thereby coupling the power node of the third electronic switch to the positive node; and
a fourth electronic switch having a negative node coupled to a second voltage potential, a power node coupled to the second node of the second resistor network, and a control node coupled to turn ON the fourth electronic switch in response to the first logic state of the first control signal thereby coupling the power node of the fourth electronic switch to the negative node.

19. The data processing system of claim 18, wherein the third circuitry comprises:
a double pole single throw electronic switch having first and second inputs coupled to the first and second nodes, respectively, of the first resistor network and first and second outputs coupled to the first and second nodes, respectively, of the second resistor network, wherein the first and second inputs are coupled to the first and second outputs, respectively, in response to the second logic state of the first control signals.

20. The termination network of claim 19, wherein the double pole single throw electronic switch comprises:
a first pass gate having source node as the first input, a drain node as the first output, and a first gate node coupled to the first control signal and a second gate node coupled to a complement of the first control signal; and
a second pass gate having source node as the second input, a drain node as the second output, and a first gate node coupled to the first control signal and a second gate node coupled to a complement of the first control signal.

* * * * *